United States Patent
Itahana et al.

(10) Patent No.: US 7,776,426 B2
(45) Date of Patent: Aug. 17, 2010

(54) CERAMIC CIRCUIT SUBSTRATE AND MANUFACTURING METHOD THEREOF

(75) Inventors: Yoshiharu Itahana, Chiyoda-ku (JP); Junji Nakamura, Chiyoda-ku (JP); Akio Sawabe, Chiyoda-ku (JP)

(73) Assignee: Dowa Metaltech Co., Ltd., Tokyo (JP)

( * ) Notice: Subject to any disclaimer, the term of this patent is extended or adjusted under 35 U.S.C. 154(b) by 384 days.

(21) Appl. No.: 11/365,887

(22) Filed: Mar. 2, 2006

(65) Prior Publication Data

US 2006/0198994 A1 Sep. 7, 2006

(30) Foreign Application Priority Data

Mar. 4, 2005 (JP) ............... 2005-060242
Mar. 31, 2005 (JP) ............... 2005-104301

(51) Int. Cl.
*B32B 9/00* (2006.01)
(52) U.S. Cl. .................. 428/210; 428/209; 428/621; 428/627; 428/632
(58) Field of Classification Search .......... 428/209, 428/210, 621, 627, 632
See application file for complete search history.

(56) References Cited

U.S. PATENT DOCUMENTS

| | | | | |
|---|---|---|---|---|
| 5,213,877 A | * | 5/1993 | Yoshida et al. | 428/209 |
| 5,621,615 A | * | 4/1997 | Dawson et al. | 361/704 |
| 5,807,626 A | * | 9/1998 | Naba | 428/210 |
| 6,299,053 B1 | | 10/2001 | Kamath et al. | |
| 6,354,484 B1 | * | 3/2002 | Sakuraba et al. | 228/124.1 |
| 6,399,019 B1 | * | 6/2002 | Sakuraba et al. | 420/501 |
| 7,219,826 B2 | * | 5/2007 | Nakamura | 228/112.1 |
| 2005/0006744 A1 | | 1/2005 | Ooi et al. | |

FOREIGN PATENT DOCUMENTS

| | | |
|---|---|---|
| EP | 0 789 397 | 8/1997 |
| JP | 7-94623 | 4/1995 |
| JP | 9-157055 | 6/1997 |

* cited by examiner

*Primary Examiner*—Cathy Lam
(74) *Attorney, Agent, or Firm*—Wenderoth, Lind & Ponack, L.L.P.

(57) ABSTRACT

A ceramic circuit substrate and a manufacturing method thereof are provided, which has excellent thermal shock tolerance by forming a gap between a circuit pattern section and a ceramic substrate, and has a capability of preventing etchant residue from remaining therein. The ceramic circuit substrate according to the present invention includes patterns of brazing material (8 and 9) formed on the ceramic substrate, and a circuit pattern section jointed to the patterns of brazing material. The patterns of brazing material includes a line pattern along the edge of the circuit pattern. Also, a gap is formed within the line pattern located between the ceramic substrate and the circuit pattern.

18 Claims, 6 Drawing Sheets

CERAMIC CIRCUIT SUBSTRATE AND MANUFACTURING METHOD THEREOF

BACKGROUND OF THE INVENTION

1. Field of the Invention

The present invention relates to a ceramic circuit substrate and manufacturing method thereof, more particularly, to a circuit substrate that has excellent thermal shock tolerance.

2. Description of the Related Art

A conventional method of manufacturing ceramic circuit substrate is shown in FIGS. 9, 10 and 11, wherein FIG. 9 is a top plan view, and FIGS. 10 and 11 are cross sectional views.

Referring now to FIG. 9, there are formed brazing material coated spots 2 that are printed in circular-shape dotted patterns, and partial full-coated sections 3 with the brazing material on the top surface of the ceramic substrate 1. The partial, fully-coated section 3 is provided for a semiconductor mounting section where e.g. a semiconductor chip is mounted. Furthermore, a brazing material fully-coated section 6 (shown in FIG. 10) is formed on the back surface of the ceramic circuit substrate 1.

Turning now to FIG. 10, an upper metal plate 4 is placed onto the brazing material coated spots 2 and partial fully-coated sections 3, a lower metal plate 5 is placed onto the brazing material fully-coated section 6, and then, forming a joint by heating in a furnace at 830° C.

After that, etching resist (not shown) is formed on the surface of upper metal plate 4 and on the surface of lower metal plate 5 respectively, and then, etch the upper metal plate 4, lower metal plate 5 and the brazing material coated spots 2 by an etchant using the etching resist as a mask. In this manner, unwanted parts of the upper metal plate 4, the lower metal plate 5 and the brazing material coated spots 2 are removed. After that, the etching resist is removed. As a result, circuit pattern section 7 composed of the upper metal plate is formed on the ceramic substrate 1; and the lower metal plate 5 which is provided for joining (soldering) with a heatsink and the like is formed on the opposite surface of the ceramic substrate 1; as shown in FIG. 11 (for example, see Japanese Patent Application Laid-open No. Hei 9-157055) . By adopting this construction, a ceramic circuit substrate, which has better property of thermal shock tolerance and tolerance to passage through a furnace as compared with the conventional circuit substrate, which has a fully jointed circuit pattern section, can be manufactured. In addition, as a conventional ceramic circuit substrate which has not improved thermal shock tolerance by the shape of brazing material, there exists an example in which brazing material is coated over the whole surface without the above-described brazing material coated spots 2.

SUMMARY OF THE INVENTION

According to a conventional method of manufacturing a ceramic circuit substrate, there are brazing material coated spots 2 where brazing material is not fully printed on a surface. Therefore, when etching the upper metal plate and lower metal plate by an etchant using an etching resist as a mask, the etchant might enter into the gap between the upper metal plate 4 and the ceramic substrate 1 around the brazing material coated spots 2, which might cause remaining of etchant residue. Since the gap between the upper metal plate and the ceramic substrate is so narrow, it is very difficult to remove the etchant residue from the gap. Note that the etchant residue might reduce the insulation performance of circuit pattern section 7 that might lead to short circuiting, and might generate corrosion of the circuit pattern section 7.

When printing the brazing material on the whole surface, the above-described gap will not be formed, thus the etchant residue will not occur, and the structure is however inferior with respect to the thermal shock tolerance.

The present invention has been achieved in view of the above-described problems. An object of the present invention is to provide a ceramic circuit substrate with excellent thermal shock tolerance and a manufacturing method thereof, wherein the ceramic substrate has a gap formed in between a metal plate and a ceramic substrate, and it is possible to prevent etchant residue from remaining in the gap.

In order to solve the above-described problems, a ceramic circuit substrate according to the present invention comprises a pattern of brazing material formed on a ceramic substrate; a metal plate jointed on the pattern of brazing material; wherein the pattern of brazing material has a line pattern formed along the edge of the metal plate, and a gap is formed located within the line pattern in between the ceramic substrate and the metal plate.

According to the ceramic circuit substrate, since there is provided a line pattern of the brazing pattern formed along the edge of the metal plate, the etchant can be prevented from entering into the gap formed between the metal plate and the ceramic substrate within the line pattern. Thus the etchant residue can be prevented from remaining in the gap.

A ceramic circuit substrate according to the present invention comprises a pattern of brazing material formed on a ceramic substrate; a circuit pattern section jointed on the pattern of brazing material; wherein the pattern of brazing material has a line pattern formed along the edge of the circuit pattern section, and a gap located within the line pattern is formed in between the ceramic substrate and the circuit pattern section.

According to the ceramic circuit substrate, since there is provided a line pattern of the brazing pattern formed along the edge of the circuit pattern section, the etchant which is used to form the circuit pattern section can be prevented from entering into the gap formed between the circuit pattern section and the ceramic substrate within the line pattern. Thus the etchant residue can be prevented from remaining in the gap.

Incidentally, the above-described line pattern includes a pattern which has non-uniform width, because the non-uniform pattern can also bring about an effect of preventing etchant from entering.

Further, for the ceramic circuit substrate according to the present invention, the pattern of brazing material may have a spot pattern allocated in the above-described gap within the line pattern.

Furthermore, regarding the ceramic circuit substrate according to the present invention, line width of the line pattern is preferably 0.05 to 2 mm, more preferably 0.1 to 1.5 mm.

Furthermore, regarding the ceramic circuit substrate according to the present invention, wherein Nickel plating or Nickel alloy plating is performed on the metal plate.

The manufacturing method of the ceramic circuit substrate according to the present invention comprises the steps of:

forming a pattern of brazing material on a ceramic substrate; jointing a metal plate onto the pattern of brazing material; and forming a pattern section composed of the metal plate on the pattern of brazing material by selectively etching the metal plate, or the metal plate and the pattern of brazing material, wherein the pattern of brazing material has a line pattern along the edge of the pattern section of the metal plate, and a gap located within the line pattern.

In addition, the manufacturing method of the ceramic circuit substrate according to the present invention includes at least following two manufacturing methods.

A first manufacturing method follows steps of: forming a pattern of brazing material on the ceramic substrate by e.g. the screen printing method; jointing a metal plate on the pattern of brazing material; and selectively etching the metal plate, to form a circuit pattern section composed of the metal plate on the pattern of brazing material. After forming the circuit pattern section, pattern of brazing material does not exist except under the circuit pattern section.

A second manufacturing method follows steps of: forming a pattern of brazing material on the ceramic substrate by e.g. a screen printing method; jointing a metal plate on the pattern of brazing material; and selectively etching the metal plate and the pattern of brazing material, to form a circuit pattern section composed of the metal plate on the pattern of brazing material. On the pattern of brazing material formed by the screen printing, the brazing material is not printed at a portion where gap to be formed between the ceramic substrate and the circuit pattern section, and the brazing material is printed e.g. on the whole area of the ceramic substrate except the gap portion. More specifically, the brazing material is coated between the circuit patterns or around the circuit pattern, and then, the metal plate and the brazing pattern is selectively etched if unwanted brazing material is needed to be removed in order to secure circuit insulation and the like.

In addition, in the first manufacturing method, the brazing material can be spilt over (or protrude from the specified pattern of brazing material) during the jointing process, for example, it is preferred to remove both brazing material and the metal plate, as is the case with the etching method of the second manufacturing method.

According to the manufacturing method of ceramic circuit substrate, since the pattern of brazing material includes a line pattern formed along the edge of the circuit pattern section, the etchant which is used to selectively etch the metal plate can be prevented from entering into the gap formed between the metal plate and the ceramic substrate within the line pattern. Thus the etchant residue is prevented from remaining in the gap.

Furthermore, in the manufacturing method of the ceramic circuit substrate according to the present invention, the pattern of brazing material is able to include a spot pattern allocated in the gap within the line pattern.

As described above, according to the present invention, a ceramic circuit substrate and manufacturing method thereof can be provided, wherein the ceramic circuit substrate has a gap between the metal plate and the ceramic substrate, can prevent etchant residue from remaining in the gap, and has excellent thermal shock tolerance. Furthermore, a ceramic circuit substrate and manufacturing method thereof can be provided, which substrate prevents wrap-around of solder in the gap caused by trickling down from the surface to the side of the metal plate during soldering process such as terminal soldering and heatsink plate soldering.

BRIEF DESCRIPTION OF THE DRAWINGS

FIGS. 1A and 1B are schematic illustrations showing a manufacturing method of a ceramic circuit substrate according to a first embodiment of the present invention, wherein FIG. 1A is a top plan view, and FIG. 1B is a cross sectional view taken along line B-B of FIG. 1A.

FIGS. 2A and 2B are schematic illustrations showing a manufacturing method of a ceramic circuit substrate according to the first embodiment of the present invention, wherein FIG. 2A is a top plan view, and FIG. 2B is a cross sectional view taken along line B-B of FIG. 2A.

FIGS. 3A and 3B are schematic illustrations showing a manufacturing method of a ceramic circuit substrate according to the first embodiment of the present invention, wherein FIG. 3A is a top plan view, and FIG. 3B is a cross sectional view taken along line B-B of FIG. 3A.

FIGS. 4A and 4B are schematic illustrations showing a manufacturing method of a ceramic circuit substrate according to the first embodiment of the present invention, wherein FIG. 4A is a top plan view, and FIG. 4B is a cross sectional view taken along line B-B of FIG. 4A.

FIGS. 5A and 5B are schematic illustrations showing a manufacturing method of a ceramic circuit substrate according to a second embodiment of the present invention, wherein FIG. 5A is a top plan view, and FIG. 5B is a cross sectional view taken along line B-B of FIG. 5A.

FIGS. 6A and 6B are schematic illustrations showing a manufacturing method of a ceramic circuit substrate according to the second embodiment of the present invention, wherein FIG. 6A is a top plan view, and FIG. 6B is a cross sectional view taken along line B-B of FIG. 6A.

FIG. 12 is a schematic illustration showing a manufacturing method of a ceramic circuit substrate according to a third embodiment of the present invention, wherein

DETAILED DESCRIPTION OF THE PREFERRED EMBODIMENTS

Figure 1A:
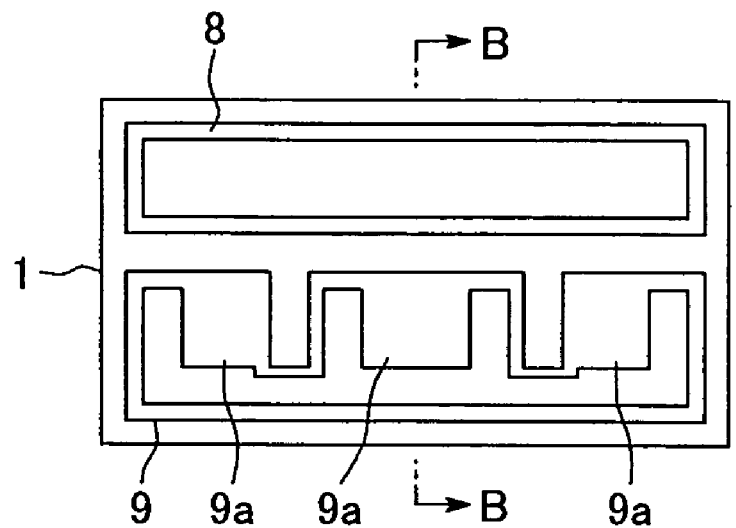

Now, referring to the drawings, embodiments of the present invention will be described in detail.

First Embodiment

FIGS. 1A to 4A and 1B to 4B are schematic illustrations showing a manufacturing method of a ceramic circuit substrate according to a first embodiment of the present invention.

Figure 1B:
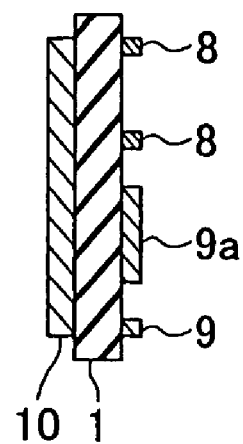

Now, referring to FIGS. 1A and 1B, there is prepared a ceramic substrate 1 composed of an AlN substrate with dimension e.g. 53 mm×29 mm×0.6 mm. Note that, in the present embodiment, an AlN substrate is used as the ceramic substrate 1, however, other ceramic substrates such as $Al_2O_3$ substrate or $Si_3N_4$ substrate can be used as well.

Further, the thickness of the ceramic substrate of around 0.1 mm to 3 mm, which is used as a typical ceramic substrate, can be used. In this regard, a preferable thickness of ceramic substrates is around 0.25 mm to 1 mm which is commonly used and is a less expensive thickness range.

Next, a first screen mask (not shown) is prepared, which has opening sections having the same pattern shown in FIG. 1A. By placing the first screen mask on the top surface of ceramic substrate 1, screen printing of paste form brazing material is performed. As a result, a pattern of brazing material 8, 9 is formed on the top surface of ceramic substrate 1. The pattern of brazing material 8 is a bordering pattern with line along edges of a rectangular shape, and the pattern line width is preferably 0.05 to 2.0 mm for example. The reason is, if the line width of the brazing material pattern is less than 0.05 mm, the jointing strength between the ceramic substrate and a metal plate, which will be jointed in the following process, is weaker than the required jointing strength of the circuit substrate, which may result in the joint being peeled off. Alternatively, in a metal plate etching process to be described hereinafter, if displacement occurs between the etching resist and the brazing material pattern, the line pattern may be exposed, which may lead to failure such that a terminal may not contact with the metal plate but with the line pattern composed of the brazing material. On the other hand, if the line width of brazing material is more than 2.0 mm, jointing strength will be so high that serious large cracks may occur on the ceramic substrate after applying repeated heat cycles. Thus, the preferable line width is 0.1 to 1.5 mm, more preferably, the line width is 0.2 to 1.0 mm, more preferably 0.2 to 0.5 mm. In addition, the above-described line-shaped brazing material part is referred to as a line pattern in the present embodiment.

The pattern of brazing material 9 has partial, fully-coated section 9a and the other part is the edge of predetermined circuit patterns to be formed afterward; that is, the line pattern composed of bordering patterns with line along edges. The fully-coated section 9a can be used as a semiconductor mounting section which mounts semiconductor chips and the like that especially requires heat dissipation. Further, a second screen mask (not shown) having opening sections with the same pattern, which is shown in FIG. 1B, is prepared. By placing the second screen mask on the back surface of ceramic substrate 1, screen printing of paste form brazing material is performed. As a result, the pattern of brazing material 10 is formed on the back surface of ceramic substrate 1. The pattern of brazing material 10 is a pattern coating over almost the whole area of the back surface on the ceramic substrate.

Incidentally, the pattern of brazing material may be coated on the whole area of the ceramic substrate except a gap section (unjointed portion). In this instance, the circuit pattern may be formed by removing not only the metal plate but also the brazing material by using a chemical agent in the following etching process.

Next, the pattern of brazing material 8, 9 is dried by keeping it at temperature of 100° C. for 30 minutes. The thickness of the pattern of brazing materials 8 to 10 is e.g. approximately 20 μm, and the brazing material contains e.g. 72 wt % Ag-26.5 wt % Cu-1.5 wt % Ti.

As the brazing material, a so-called brazing material containing active metals such as Ag—Cu—Ti base brazing or Al—Si—Ti base brazing that is used to join a ceramics and metal, is preferred to be used. The thickness of the pattern of brazing material is preferably around 5 to 30 μm, and this thickness substantially corresponds to gap size between the ceramic substrate and the metal circuit plate formed in the following process. If the thickness of the pattern of brazing material is less than 5 μm, jointing strength between the ceramic substrate and the metal circuit plate is insufficient, which may cause the joint to be peeled off. On the other hand, if the thickness is more than 30 μm, a large stress may occur on the ceramic substrate due to high jointing strength, and thermal shock tolerance may be deteriorated. Thus, the preferable thickness of the pattern of brazing material is 10 to 25 μm.

Figure 2A:
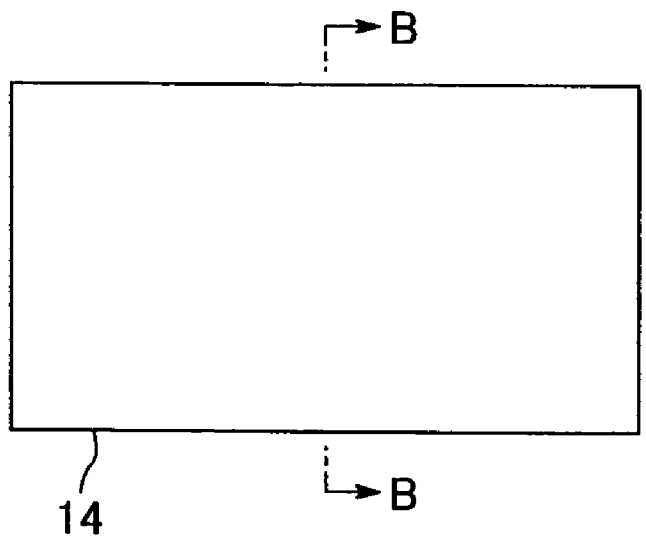
Figure 2B:
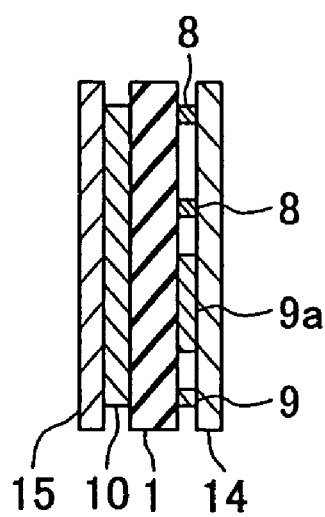

Referring next to the FIGS. 2A and 2B, an upper metal plate 14 composed of copper plate is placed onto the pattern of brazing material 8, 9 as shown therein, and a lower metal plate 15 composed of copper plate is placed onto the pattern of brazing material 10. The thickness of the upper metal plate 14 is 0.1 to 1.0 mm, preferably 0.15 to 0.5 mm; the thickness of the lower metal plate 15 is 0.1 to 1.0 mm, preferably 0.1 to 0.5 mm.

One of an industrial application of the circuit substrate of the present invention is a circuit substrate for a power module on which high power devices are mounted. In this instance, if the metal plate thickness is less than 0.1 mm, the capacity for electrical power is not sufficient; if the thickness is more than 1.0 mm, the thermal shock tolerance of the circuit substrate may sometimes be deteriorated. Thus the above-described thickness range is preferred.

Next, the ceramic substrate shown in FIG. 2 is put into a vacuum furnace, and then kept at 850° C. for 30 minutes. As a result, the upper metal plate 14 is jointed with the patterns of brazing material 8, 9, and the lower metal plate 15 is jointed with the pattern of brazing material 10. More specifically, the upper metal plate 14 is jointed onto the top surface of the ceramic substrate 1 through the patterns of brazing material 8, 9 and the lower metal plate 15 is jointed onto the back surface of the ceramic substrate 1 through the pattern of brazing material 10.

Figure 3A:
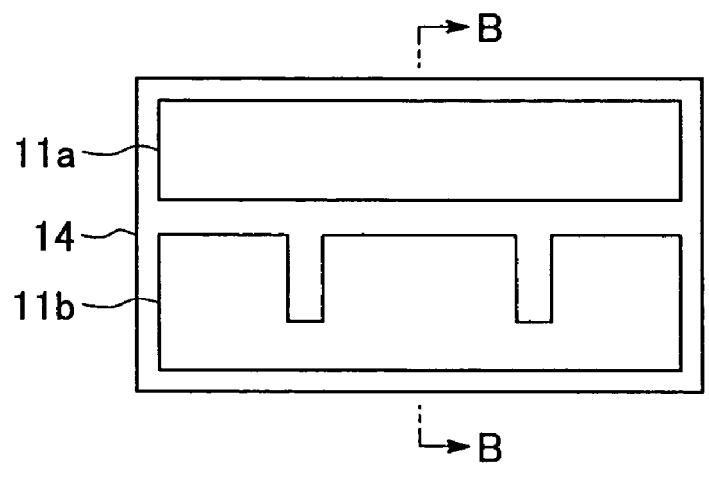

A third screen mask (not shown) having opening sections with the pattern which is shown in FIG. 3A is prepared. By placing the third screen mask on the upper metal plate 14, screen printing of etching resist material can be performed. As a result, etching resists 11a and 11b are formed on the upper metal plate 14. Etching resists 11a and 11b become hardened by irradiating ultraviolet light onto the etching resists 11a and 11b. The etching resist 11a is formed in almost the same rectangular pattern to the outer shape of the pattern of brazing material 8 and is allocated on the pattern of brazing material 8. The etching resist 11b is formed in almost the same pattern as the outer shape of the pattern of brazing material 9 and is allocated on the pattern of brazing material 9.

Figure 3B:
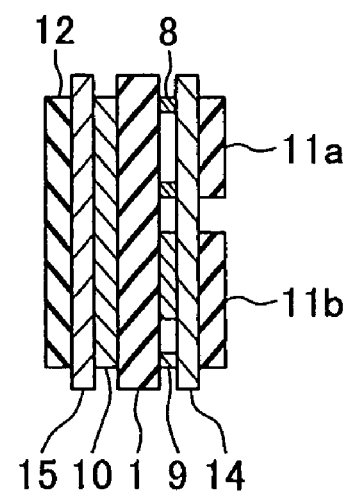

Furthermore, a fourth screen mask (not shown) having opening sections of the same pattern shown in FIG. 3B is prepared. By placing the fourth screen mask on the lower metal plate 15, screen printing of etching resist material is performed. As a result, etching resist 12 is formed on the lower metal plate 15. Then, etching resist 12 becomes hardened by irradiating ultraviolet light onto the etching resist 12. The etching resist 12 is formed in almost the same pattern as the outer shape of the pattern of brazing material 10 and is allocated on the pattern of brazing material 10.

Figure 4A:
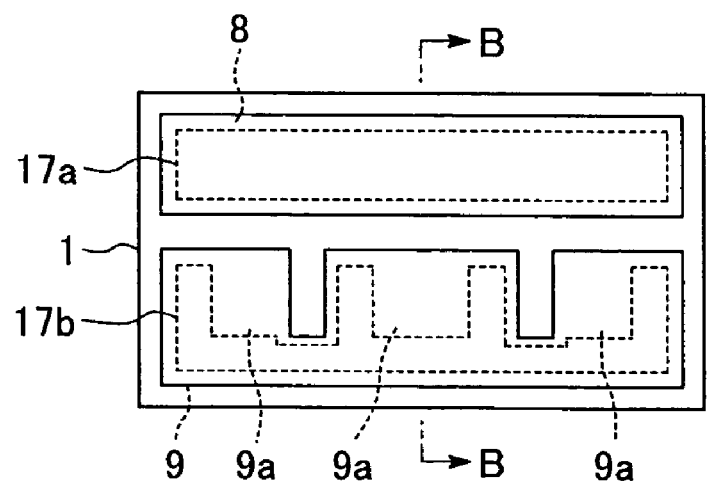
Figure 4B:
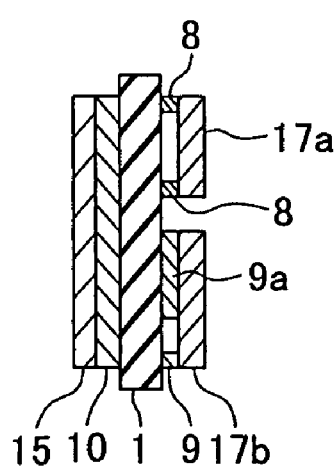

And then, as shown in FIG. 4, the upper metal plate 14 and the lower metal plate 15 are etched respectively by etchant such as a mixed solution of copper chloride and hydrogen peroxide solution, or ferric chloride base etchant, by using etching resists 11a, 11b and 12 as masks. As a result, unwanted portions of the upper metal plate 14 and the lower metal plate 15 are dissolved and removed. And then, etching resists 11a, 11b and 12 are removed by a sodium hydroxide solution. Here, referring to FIGS. 4A and 4B, circuit pattern sections 17a and 17b composed of the upper metal plate are formed on a top surface of the ceramic substrate 1 through patterns of brazing material 8 and 9; and the lower metal plate 15 is formed on back surface of the ceramic substrate 1 through the pattern of brazing material 10.

Next, as the occasion demands electroless nickel-phosphor plating (not shown) is performed on the surface of circuit pattern sections 17a, 17b and lower metal plate 15.

The ceramic circuit substrate thus manufactured has a structure shown in FIG. 4. The patterns of brazing material 8 and 9 are formed on the ceramic substrate 1, and the circuit pattern sections 17a and 17b are jointed on the patterns of brazing material 8 and 9. The patterns of brazing material 8 and 9 include line patterns formed along the edge of the circuit pattern sections 17a and 17b, or formed bordering the edge thereof. In the present embodiment, uniform width of the line pattern is used, and the width of the line pattern is however not necessarily uniform.

According to the first embodiment, the patterns of brazing material 8 and 9 are formed in a line-shaped, bordering pattern of the outline of e.g. rectangle shape. Thus, when etching the upper metal 14 by etchant using the etching resists 11a and 11b as a mask, entering of etchant into a gap between the circuit patterns 17a and 17b, and the ceramic substrate located within the patterns of brazing material 8 and 9 can be prevented by the existence of the brazing material, thus the remaining etchant residue within the gap can be prevented. As a result, deterioration of insulation or short circuiting of circuit pattern sections 17a and 17b can be suppressed. Therefore, corrosion of circuit pattern sections 17a and 17b can be suppressed.

According to the first embodiment, the patterns of brazing material 8 and 9 are formed in a bordering pattern of the outline of the circuit patterns, in order to form a section (or gap) that is not coated with brazing material under circuit pattern section 17a and 17b. By forming a section, which is not coated with brazing material between the circuit pattern section and the ceramic substrate, thermal stress applied to the ceramic substrate can be reduced when thermal shock is applied to the circuit pattern section. Accordingly, thermal shock tolerance can be improved. It follows that parts, which generate large thermal stress such as terminals, are preferred to be mounted on the surface of the floating pattern of circuit plate.

An area of the floating pattern is preferred to be more than 4 $mm^2$. The reason is, if the area is smaller than 4 $mm^2$, a thermal stress relaxation capability is insufficient. For that purpose, more than 9 $mm^2$ is further preferred.

Further, at least one portion of the floating pattern is preferred to be situated adjacent to the line pattern. When a floating pattern is of a shape including a line, such as an approximately rectangular shape, at least one side is preferably situated adjacent to the line pattern. More preferably two sides, and furthermore preferably three or more sides are situated adjacent to the line pattern. The reason is, if the floating pattern is adjacent to the line pattern, a sufficient relaxation effect of thermal stress can be obtained.

In addition, a gap may be formed only directly underneath the floating pattern where parts such as the terminal are mounted (in other words, underneath the soldering section).

Furthermore, even when defects occur on the ceramic circuit substrate after applying heat cycles thereto, by forming the floating pattern with the brazing material as a line pattern, the defect can be prevented from occurring at the portion other than the jointed interface between the line pattern of brazing material and ceramic substrate or the thin surface layer of the ceramic substrate, thus suppressing occurrence of serious cracks on the ceramic substrate. The term "serious crack" indicates a crack which passes completely through the ceramic substrate in a thickness direction or a comparatively deep one (when the ceramic substrate is 0.6 mm thick, approximately 0.2 mm in depth or more (about ⅓ or more of a thickness of the ceramic substrate)), which may destroy or might destroy insulation of the top and back surfaces, which is one of the basic characteristics of the circuit substrate.

Furthermore, in the present embodiment, by forming patterns of brazing material 8 and 9 in a bordering pattern of the outline of a circuit pattern, it is possible for solder material to be prevented from entering into a gap under the circuit pattern when connecting terminals onto the circuit pattern sections 17a and 17b by soldering. Due to the wrap-around of solder material, inclination of the terminal may occur, which might cause a problem in an assembling operation into an electronic equipment.

In addition, during a soldering operation of parts such as the above-described terminal, large thermal stress may be generated at the corresponding portion of a ceramic substrate, which may cause the occurrence of serious cracks; the present embodiment can also solve this problem.

Second Embodiment

Figure 5A:
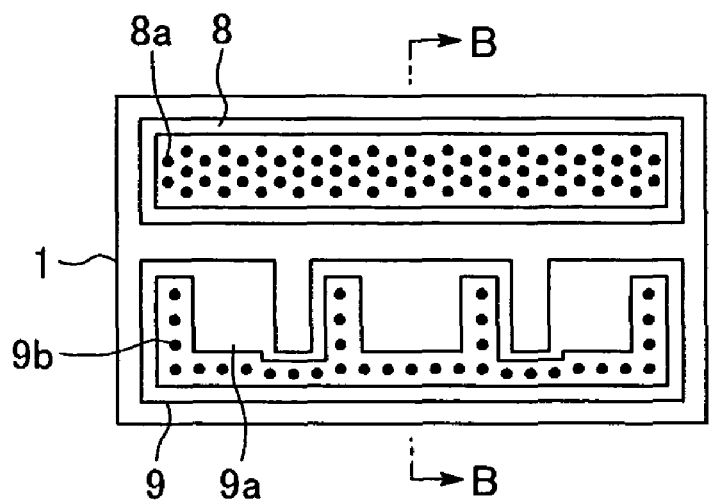
Figure 5B:
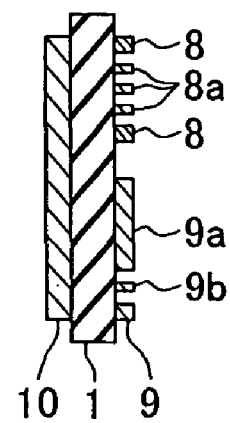
Figure 6A:
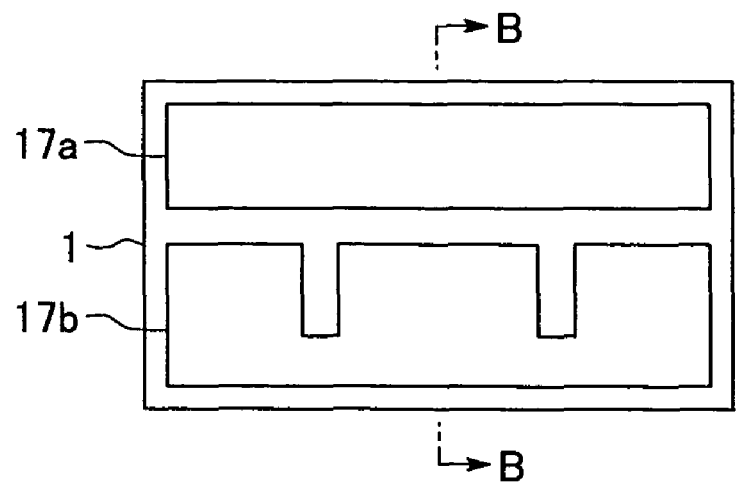
Figure 6B:
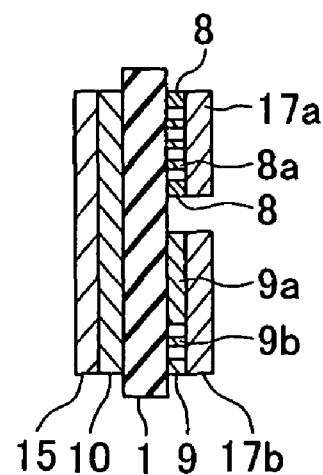

FIGS. 5A, 5B, 6A and 6B are schematic illustrations showing a manufacturing method of a ceramic circuit substrate according to a second embodiment of the present invention, wherein FIGS. 5A and 6A are top planviews, and FIGS. 5B and 6B are cross sectional views taken along lines B-B of FIGS. 5A and 6A. Identical numbers are put at the same section shown in FIGS. 1A to 4B. Incidentally, in this embodiment, a difference of this embodiment from the first embodiment is that circular-shaped spot pattern is added to the patterns of brazing material 8 and 9.

A first screen mask (not shown) having opening sections with the pattern, which is shown in FIG. 5A, is prepared. By placing the first screen mask on the top surface of ceramic substrate 1, screen printing of paste forming brazing material is performed. As a result, patterns of brazing material 8, 9 are formed on the top surface of ceramic substrate 1. The brazing pattern 8 has plurality of circular-shaped spot patterns 8a within the line pattern that is added to the line pattern of bordering of rectangular shape, which is as same as in the first embodiment. The brazing pattern 9 has plurality of circular-shaped spot patterns 9b within the line pattern that is added to the line pattern of bordering of rectangular shape and partial, fully-coated section, which is as same as in the first embodiment. The diameter of the spot patterns 8a and 9b is preferably from 0.1 to 1.0 mm. If the diameter is less than 0.1 mm, a floating pattern may bulge while heated during a soldering operation; if larger than 1 mm, a large crack may occur on the ceramic substrate after applying heat cycles. More preferably, the diameter is 0.1 to 0.5 mm.

Moreover, with respect to separation between the spot patterns, the distance between outer circumferences of circles is preferably 0.05 to 1 mm; more preferably, it is approximately 0.1 to 0.65 mm. The reason is, if the distance is smaller than 0.05 mm, it is so small that adjacent spot patterns might coalesce during the jointing process; in addition, the smaller distance increases the density of spot patterns, and consequently, thermal shock tolerance, which is provided by a gap between the spots, might not be sufficiently achieved. On the other hand, if the distance is larger than 1 mm, stress occurring in each circular-shaped joint section (a joint section of spot pattern and metal plate to be described below) is increased, and thus sufficient thermal shock tolerance may not be achieved.

In addition, the shape of the spot pattern may be altered to other shapes such as a triangle or a rectangle and the like from the above-described circular-shape, however, it is preferred that the coating area of these shapes correspond to the coating area of the circular-shape pattern.

Next, a second screen mask (not shown) having opening sections of the pattern shown in FIG. 5B is prepared. By placing the second screen mask on the back surface of ceramic substrate 1, screen printing of paste forming brazing material is performed. As a result, a pattern of brazing material 10 is formed on the back surface of ceramic substrate 1. The pattern of brazing material 10 is a pattern coating almost the whole area of the back surface of the ceramic substrate.

And then, the patterns of brazing material 8, 9 are dried by keeping it at temperature 100° C. for 30 minutes, which is the same as the first embodiment. The thickness of the patterns of brazing material 8, 9 and 10, and the composition of the brazing material are the same as those of the first embodiment.

After that, an upper metal plate 14 is placed onto the patterns of brazing material 8 and 9, and the lower metal plate 15 is placed onto the pattern of brazing material 10 as same as the first embodiment. The upper metal plate 14 is jointed (connected) with the patterns of brazing material 8 and 9, and the lower metal plate 15 is jointed with the pattern of brazing material 10 as in the first embodiment.

And then, the upper metal plate 14 and the lower metal plate 15 are etched respectively in the same way as in the first embodiment, and thereby, as shown in FIGS. 6A and 6B, circuit pattern sections 17a and 17b composed of the upper metal plate are formed on the top surface of the ceramic substrate 1 through patterns of brazing material 8 and 9; and the lower metal plate 15 is formed on the back surface of the ceramic substrate 1 through the pattern of brazing material 10.

Next, electroless nickel-phosphor plating is performed on the top surface of the circuit pattern section 17a, 17b and the lower metal plate 15 (not shown).

In the second embodiment also, the same effect as that of the first embodiment can be achieved.

Further, since the circuit pattern sections 17a and 17b are jointed by spots patterns 8a and 9b, when soldering the terminals and the like in the circuit pattern sections 17a and 17b, it is possible to suppress the occurrence of bulging in the circuit pattern sections during a soldering operation due to the heat from soldering.

It is not known exactly why the bulging occurs, but it is estimated that gasified material such as moisture or organic matter in the brazing material is contained in the floating pattern portion for some reason, or it is due to thermal expansion of the metal plate.

Third Embodiment

Figure 12A:
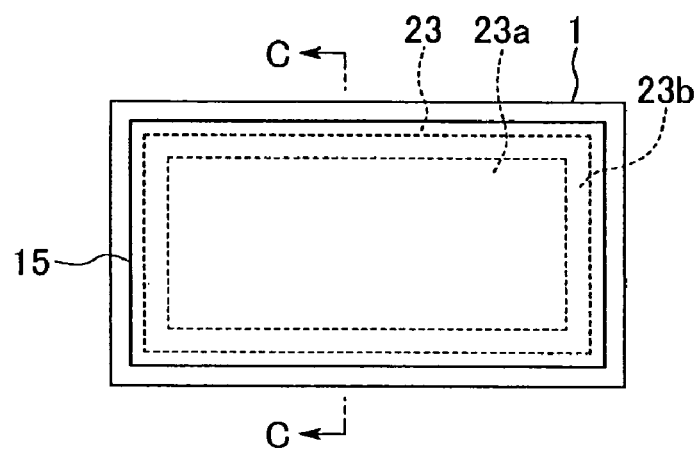
FIG. 12A is a back plan view.
Figure 12C:
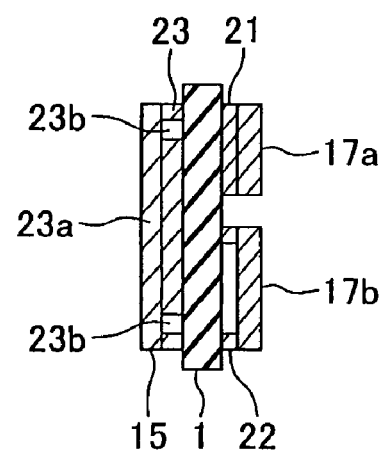
FIG. 12C is a cross sectional view taken along line C-C shown in FIGS. 12A and 12B.
Figure 12B:
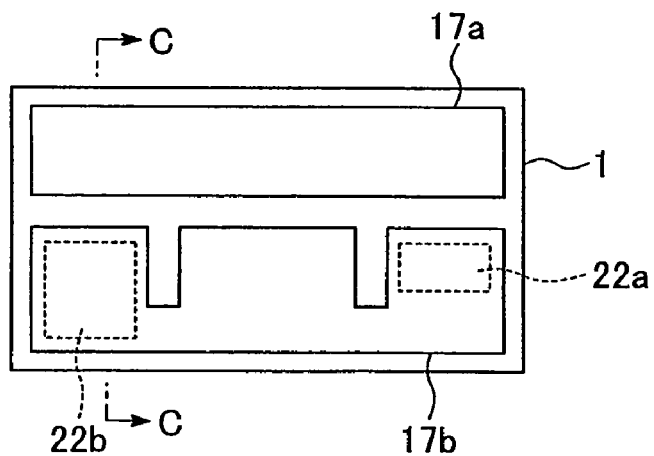
FIG. 12B is a top plan view.

FIG. 12 is a schematic illustration showing a manufacturing method of a ceramic circuit substrate according to a third embodiment of the present invention, wherein FIG. 12A is a back plan view, FIG. 12B is a top plan view, and FIG. 12C is a cross sectional view taken along line C-C shown in FIGS. 12A and 12B. The same numbers are put on the same section shown in FIGS. 1 to 4. In this embodiment, a difference from the first embodiment is the shape of the pattern of brazing material formed on the top side and the back side.

A first screen mask (not shown) having opening sections with the patterns of brazing material 21 and 22 as shown in FIGS. 12B and 12C is prepared. By placing the first screen mask on the top surface of ceramic substrate 1, screen printing of paste form brazing material is performed. As a result, the patterns of brazing material 21 and 22 are formed on the top surface of the ceramic substrate 1. The pattern of brazing material 21 is a pattern with coating over the whole area. The pattern of brazing material 22 is provided with a first gap 22a and the second gap 22b, and other area is fully-coated pattern shape of brazing material.

Furthermore, a second screen mask (not shown) having opening sections having a pattern shape corresponding to the pattern of brazing material as shown in FIGS. 12A and 12C is prepared. By placing the second screen mask on the back surface of ceramic substrate 1, then, screen printing of paste form brazing material is performed. As a result, patterns of brazing material 23 and 23a are formed on the back surface of ceramic substrate 1. The pattern of brazing material 23 is formed in a line bordering pattern of the outline of rectangle shape as in the first embodiment. The pattern of brazing material 23a is a pattern with partial, fully coated area within the pattern of brazing material 23. Gap 23b is formed between the pattern of brazing material 23a and the pattern of brazing material 23.

And then, the patterns of brazing material 21, 22, 23 and 23a are dried by maintaining the brazing material at a temperature of 100° C. for 30 minutes as in the first embodiment. The thickness of the patterns of brazing material 21, 22, 23 and 23a, and the composition of brazing material are the same as the first embodiment.

An upper metal plate is placed onto the patterns of brazing material 21 and 22, and a lower metal plate is placed onto the patterns of brazing material 23 and 23a in the same manner as the first embodiment. The upper metal plate is joined with the patterns of brazing material 21 and 22, and the lower metal plate is joined with the patterns of brazing material 23 and 23a in the same manner as the first embodiment.

And then, the upper metal plate and the lower metal plate are etched respectively with the same method as in the first embodiment, and as a result, as shown in FIGS. 12B and 12C, circuit pattern sections 17a and 17b composed of the upper metal plate are formed on the top surface of the ceramic substrate 1 through the patterns of brazing material 21 and 22; and as shown in FIGS. 12A and 12C, the lower metal plate 15 is formed on the back surface of the ceramic substrate 1 through the patterns of brazing material 23 and 23a.

Next, electroless nickel-phosphor plating is performed on the circuit pattern sections 17a, 17b, and the surface of the lower metal plate 15 (not shown).

One of the reasons for forming the first and the second gap sections 22a and 22b is to obtain thermal shock tolerance when connecting (soldering) an output terminal (not shown) on the circuit pattern section 17b which is located on the gaps 22a and 22b respectively. The gaps 22a and 22b are of an approximately rectangular shape. At least three sides of the gaps 22a and 22b are adjacent to the line pattern.

According to the above-described third embodiment, the pattern of brazing material 23 is formed in a line, bordering the outline of the lower metal plate 15 which is of rectangular shape. Thus, when the upper metal is etched by an etchant, entering of etchant into the gap composed of the lower metal plate 15 and the ceramic substrate 1 located within the pattern of brazing material 23 can be prevented by the existence of the brazing material, and also, remaining of the etchant residue within the gap can be prevented. As a result, corrosion of the metal plate 15 can be suppressed by the same operation as that of the first embodiment or the second embodiment.

According to the present embodiment, the pattern of brazing material 23 is formed in a bordering pattern of outline of the lower metal plate 15, and a section uncoated by brazing material (namely, gap section 23b) is formed inside the lower metal plate 15. By forming the section uncoated by brazing material between the lower metal plate 15 and the ceramic substrate 1, when thermal shock is applied to the lower metal plate 15, thermal stress given to the ceramic substrate can be reduced. Thus, heat cycle tolerance can be improved. For this reason, when a member such as a heatsink plate that generates large thermal stress is mounted on the surface of lower metal 15, the ceramic circuit substrate has excellent thermal shock tolerance.

Referring now to Table 1, evaluation on soak characteristics of etchant, characteristic feature of heat cycles, and characteristic feature of soldering is carried out for each sample of Examples 1 to 15 of printing pattern of brazing material and Comparative examples 1 and 4. The evaluation results will be explained with reference to Table 1, FIG. 7 and FIG. 8.

TABLE 1

| | No. | Soak Condition of Etching Agent | Heat Cycle Tolerance Crack Tolerance, Catastrophic Mode | | | Soldering Property | | Printed Shape of Brazing Material Point Contact Section | | Borderline Width |
|---|---|---|---|---|---|---|---|---|---|---|
| | | | 100 Cycles | 200 Cycles | 300 Cycles | Wrap-aroun | Bulge | ø Diameter | Center Distance | |
| Example | 1 | N/A | No Crack | No Crack | Ceramic | N/A | N/A | ø0.8 | 0.85 | 0.5 |
| | 2 | N/A | No Crack | No Crack | Ceramic | N/A | N/A | ø0.6 | 0.85 | 0.5 |
| | 3 | N/A | No Crack | No Crack | No Crack | N/A | N/A | ø0.4 | 0.85 | 0.5 |
| | 4 | N/A | Jointing Interface | Jointing Interface | Jointing Interface | N/A | Slightly | — | — | 0.25 |
| | 5 | N/A | Jointing Interface | Jointing Interface | Jointing Interface | N/A | Slightly | — | — | 0.5 |
| | 6 | N/A | Jointing Interface | Jointing Interface | Jointing Interface | N/A | N/A | ø0.2 | 0.85 | 0.5 |
| | 7 | N/A | No Crack | Jointing Interface | Jointing Interface | N/A | N/A | ø0.1 | 0.21 | 0.5 |
| | 8 | N/A | No Crack | Jointing Interface | Jointing Interface | N/A | N/A | ø0.2 | 0.21 | 0.5 |
| | 9 | N/A | No Crack | Jointing Interface | Jointing Interface | N/A | N/A | ø0.4 | 0.5 | 0.5 |
| | 10 | N/A | No Crack | No Crack | No Crack | N/A | N/A | ø0.1 | 0.15 | 0.5 |
| | 11 | N/A | No Crack | No Crack | No Crack | N/A | N/A | ø0.2 | 0.3 | 0.5 |
| | 12 | N/A | Jointing Interface | Jointing Interface | Jointing Interface | N/A | N/A | ø0.1 | 0.3 | 0.5 |
| | 13 | N/A | No Crack | No Crack | No Crack | N/A | N/A | ø0.5 | 0.85 | 1.5 |
| | 14 | N/A | No Crack | No Crack | No Crack | N/A | N/A | ø0.2 | 0.3 | 0.2 |
| | 15 | N/A | No Crack | No Crack | Jointing Interface | N/A | N/A | — | — | 0.5 |
| Comparative Example | 1 | Detected | Jointing Interface | Jointing Interface | Jointing Interface | Detected | N/A | ø0.2 | 0.85 | — |
| | 2 | N/A | No Crack | Ceramic | Ceramic | N/A | N/A | Printed on Whole Area | | — |
| | 3 | N/A | No Crack | Ceramic | Ceramic | N/A | N/A | — | — | 2.5 |
| | 4 | Detected | Jointing Interface | Jointing Interface | Jointing Interface | N/A | N/A | — | — | 0.025 |

Figure 7:
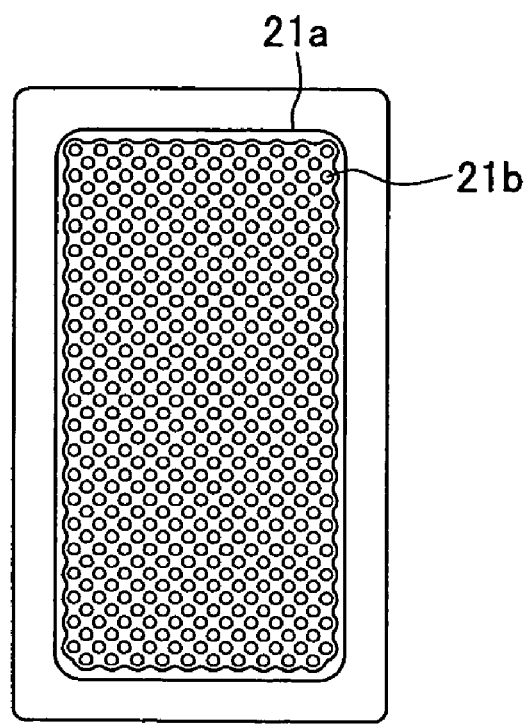
FIG. 7 is a top plan view showing a brazing material pattern on a ceramic circuit substrate according to example 2.

FIG. 7 is a top plan view showing a pattern of brazing material on a sample (ceramic circuit substrate) of Example 2. The sample of Example 2 is manufactured by the same method as that of the second embodiment, forming a pattern of brazing material on an AlN substrate with dimension 53 mm×29 mm×0.6 mm, such as line pattern 21a bordering the outline of a rectangle having four rounded corners (R1), and a plurality of circular-shaped spot patterns 21b allocated within the line pattern, and then, jointing a copper plate with four rounded corners (R2) having the same outline dimension of the pattern of brazing material that is 28 mm×14 mm×0.3 mm (not shown) on the pattern of brazing material. The width of the line pattern 21a (bordering width) is 0.5 mm. The diameter of the spot pattern 21b is φ0.6 mm, the spot patterns 21b are allocated in lattice shape, and the center-to-center distance between the spot patterns (circular shape) is 0.85 mm.

A copper plate having dimensions of 28 mm×14 mm×0.15 mm (not shown) is jointed on the back side of the AlN substrate at the symmetric position of the plate attached on the top surface, with brazing material coated over the whole joint interface. Next, electroless nickel-phosphor alloy plating with 3 μm of thickness is performed on the surface of the copper plate.

In Example 1, a sample is manufactured in completely the same way as that in the Example 2 except in that the diameter of spot pattern used in Example 2 shown in FIG. 7 is altered to φ0.8 mm.

In Example 3, a sample is manufactured in completely the same way as that in the Example 2 except in that the diameter of spot pattern used in Example 2 shown in FIG. 7 is altered to φ0.4 mm.

Figure 8:
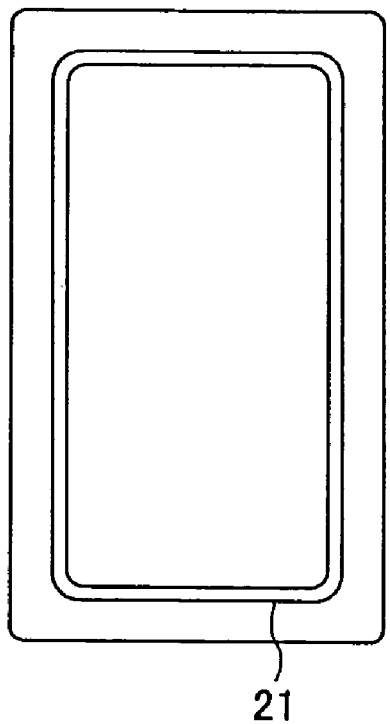
FIG. 8 is a top plan view showing a brazing material pattern on a ceramic circuit substrate according to example 5.
Figure 9:
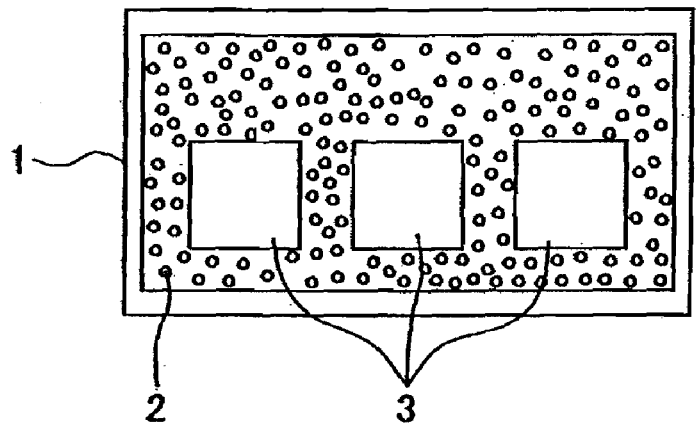
FIG. 9 is a top plan view showing a manufacturing method of a conventional ceramic circuit substrate.
Figure 10:
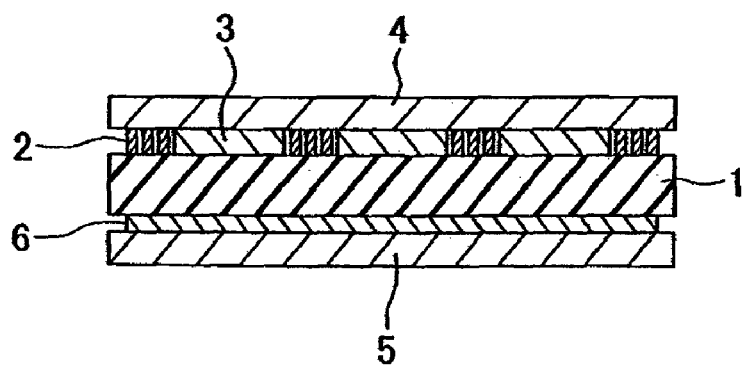
FIG. 10 is a cross sectional view showing a manufacturing method of the conventional ceramic circuit substrate.
Figure 11:
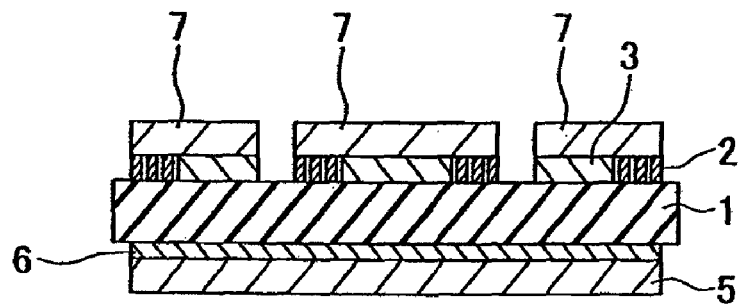
FIG. 11 is a cross sectional view showing a manufacturing method of the conventional ceramic circuit substrate.

FIG. 8 is a top plan view showing the pattern of brazing material of a sample (ceramic circuit substrate) used in Example 5. In Example 5, a pattern of brazing material 21 composed of a line pattern bordering the outline of a rectangle having four rounded corners (R1) on the surface of an AlN substrate with dimensions of 32 mm×18 mm×0.6 mm is formed with the same method as the first embodiment, and then jointing a copper plate (not shown) with four rounded corners (R2) having outline dimension of 28 mm×14 mm×0.3 mm, which is the same as outer dimension of the pattern of brazing material, onto the pattern of brazing material 21. The width of the line pattern is 0.5 mm.

A copper plate with dimensions of 28 mm×14 mm×0.15 mm (not shown) is joined on the back side of the AlN substrate at a symmetric position of the plate attached on the top surface, with brazing material coated over the whole joint interface. Next, electroless nickel-phosphor alloy plating with 3 μm of thickness is performed on the surface of the copper plate.

In Example 4, the width of line pattern used in Example 5 shown in FIG. 8 is altered to φ0.25 mm, and except for this point, a sample used in practical example 4 is manufactured in the same way as the sample used in Example 5.

In Example 6, the diameter of spot pattern used in Example 2 shown in FIG. 7 is altered to φ0.2 mm, and except for this point, a sample used in Example 6 is manufactured in the same way as the sample used in Example 2.

In Example 7, the diameter of spot pattern is altered to φ0.1 mm and the distance between spot patterns is altered to 0.21 mm from the sample used in Example 2 shown in FIG. 7, and except for these points, a sample used in Example 7 is manufactured in the same way as the sample used in Example 2.

In Example 8, the diameter of spot patterns is altered to φ0.2 mm and the distance between spot patterns is altered to 0.21 mm from the sample used in Example 2 shown in FIG. 7, and except for these points, a sample used in Example 8 is manufactured in the same way as the sample used in Example 2.

In Example 9, the diameter of spot patterns is altered to φ0.4 mm and the distance between spot patterns is altered to 0.5 mm from the sample used in Example 2 shown in FIG. 7, and except for these points, a sample used in Example 9 is manufactured in the same way as the sample used in Example 2.

In Example 10, the diameter of spot patterns is altered to φ0.1 mm and the distance between spot patterns is altered to 0.15 mm from the sample used in Example 2 shown in FIG. 7, and except for these points, a sample used in Example 10 is manufactured in the same way as the sample used in Example 2.

In Example 11, the diameter of spot patterns is altered to φ0.2 mm and the distance between spot patterns is altered to 0.3 mm from the sample used in Example 2 shown in FIG. 7, and except for these points, a sample used in Example 11 is manufactured in same way as the sample used in Example 2.

In Example 12, the diameter of spot patterns is altered to φ0.1 mm and the distance between spot patterns is altered to 0.3 mm from the sample used in Example 2 shown in FIG. 7, and except for these points, a sample used in Example 12 is manufactured in the same way as the sample used in Example 2.

In Example 13, the diameter of spot patterns is altered to φ0.5 mm, the distance between spot patterns is altered to 0.85 mm and the width of bordering line is altered to 1.5 mm from the sample used in Example 2 shown in FIG. 7, and except for these points, a sample used in Example 13 is manufactured in the same way as the sample used in Example 2.

In Example 14, the diameter of spot patterns is altered to φ0.2 mm, the distance between spot patterns is altered to 0.3 mm, and the width of bordering line is altered to 0.2 mm from the sample used in Example 2 shown in FIG. 7, and except for these points, a sample used in Example 10 is manufactured in the same way as the sample used in Example 2.

In Example 15, a gap section of 0.2 mm in width is manufactured along with the line pattern within line pattern used in Example 5 shown in FIG. 8, and within the gap section is fully-coated with a brazing material, and except for this point, a sample used in practical example 5 is manufactured in the same way as the sample used in Example 5.

In Comparative example 1, a sample has no line pattern but only spot patterns, and except for this point, a sample used in Comparative example 1 is manufactured in the same way as the sample used in Example 6.

In Comparative example 2, a sample is manufactured by the same method as the first embodiment and without having the line pattern used in Example 5, pattern of brazing material with fully-coated section in a rectangular shape having four rounded corners on the surface of AlN substrate, and then jointing a copper plate (not shown) which has the same shape as the pattern of brazing material.

In Comparative example 3, the width of the line pattern is altered to 2.5 mm from the sample used in Example 5 shown in FIG. 8, and except for this point, a sample used in Comparative example 3 is manufactured in the same way as the sample used in Example 5.

In Comparative example 4, the width of the line pattern is altered to 0.025 mm from the sample used in Example 5 shown in FIG. 8, and except for this point, a sample used in Comparative example 4 is manufactured in the same way as the sample used in Example 5.

(1) Soak Condition of Etchant

Soak condition of etchant for the ceramic circuit substrate of above-described Examples 1 to 14 and Comparative examples 1 to 4 were investigated. The results are described below and shown in Table 1.

When peeling off the copper plate from ceramic circuit substrate manufactured by the method of Comparative example 1, etchant residue in green color which is estimated to be copper chloride, and also, some portion of silver material which is estimated to be nickel plating were seen on the back side of the copper and also on the surface of the AlN substrate. These contaminations such as etchant residue are considered to lead to insulation failure or corrosion of the copper plate.

When peeling off the copper plate from the ceramic circuit substrate manufactured by the method of Examples 1 to 14 respectively, no contamination was seen on the back side of the copper plate and on the surface of AlN substrate.

When peeling off the copper plate from the ceramic circuit substrate manufactured by the method of Comparative examples 2 and 3, since the pattern of brazing material was coated on the whole surface on the sample and no floating pattern was formed, thus, no contamination described above was found.

In Comparative example 4, since patterns of brazing material and resist are displaced from each other during the etching process, some opening portion is formed and soak of etchant is detected.

(2) Heat Cycle Test and Catastrophic Mode Thereof

Heat cycle test was carried out for ceramic circuit substrates of above-mentioned Examples 1 to 14 and Comparative examples 1 to 4 respectively. One cycle of the heat cycle test was carried out with the following steps; cool down from room temperature to −40° C., keeping at −40° C. for 30 minutes, warm to room temperature from −40° C., keeping in room temperature for 10 minutes, heat up from room temperature to 125° C., keeping at 125° C. for 30 minutes, cool down from 125° C. to room temperature, keeping in room temperature for 10 minutes. Visual inspection of the ceramic circuit substrates was carried out after 100 cycles, 200 cycles and 300 cycles. The results are shown in the Table 1. Two catastrophic modes were observed such as ceramic breaking and breaking at joint-contact interface (or breaking at thin surface of the ceramic substrate). Ceramic breaking is a catastrophic mode where cracking occurs in the ceramic substrate, which is not permissible because the catastrophic mode may break or might break insulation between the top and bottom surface of ceramic substrate. Breaking at the joint-contact interface (which includes thin surface breaking at ceramic substrate) is a catastrophic mode that is delamination between patterns of brazing material and ceramic substrate, which may not lead to functional (serious) problems because the catastrophic mode does not destroy the circuit between the top and back surfaces of the ceramic substrate. However, most preferable status is that no breaking can be found.

(3) Soldering Property: Solder Wraparound

Solder wraparound condition was observed while soldering a copper terminal which is 1 mm in thickness, 3 mm in width onto an edge part of a copper plate jointed to a ceramic circuit substrate. The result is shown below and in Table 1. The solder material used in this examination is eutectic solder foil, and soldering was performed by placing the copper terminal onto the solder foil (the thickness is 0.1 mm) and heating at 230° C. for 1 minute.

Since each ceramic circuit substrate was jointed to the copper plate in whole interface including edge part by the pattern of brazing material used in Examples 1 to 14 and the Comparative example 2, no solder wraparound on the backside of copper plate (more specifically, gap between the copper plate and AlN substrate) was detected. On the ceramic substrate used in the Comparative example 1, solder wraparound was observed at the gap between the copper plate and the AlN substrate.

(4) Soldering Property: Copper Plate Blister

Copper plate blister was observed during the above-described soldering operation which is to heat treat the ceramic circuit substrate. No serious bulging was observed on the entire samples, however, on ceramic circuit substrates of Examples 4 and 5, there seemed to be a very slight bulge.

While the invention has been particularly shown and described with reference to the preferred embodiments and Examples, it will be understood by those skilled in the art that various changes in form and details may be made therein without departing from the spirit and scope of the invention as defined by the appended claims. Thus the contents of the brazing material can be altered to various compositions.

While the upper metal plate and lower metal plate made of copper are used in the first and second embodiment, however, e.g. aluminum plate, copper alloy plate or aluminum alloy plate can be used for the upper and lower metal plates instead of the copper plate.

While the top view of the spot patterns are circular in the second embodiment, however, e.g. ellipse, rectangle and lozenge can be used instead of the circular shape.

While the spot patterns are allocated within the line pattern in the second embodiment, however, e.g. line pattern can be also allocated.

| (Reference Numerals) | |
|---|---|
| 1 | ceramic substrate |
| 2 | brazing material coated spots |
| 3 | partial, fully-coated section |
| 4, 14 | upper metal plate |
| 5, 15 | lower metal plate |
| 6, | fully-coated brazing material |
| 7, 17a, 17b | circuit pattern section |
| 8, 9, 10 | pattern of brazing material |
| 8a, 9b, 21b | spots pattern |
| 9a | fully-coated section |
| 11a, 11b, 12 | etching resist |
| 21 | pattern of brazing material |
| 21a | line pattern |

The invention claimed is:

1. A ceramic circuit substrate comprising:
a ceramic substrate;
a pattern of brazing material formed on the ceramic substrate; and
a metal plate jointed onto the pattern of brazing material,
wherein a gap is formed between the ceramic substrate and the metal plate,
wherein the pattern of brazing material includes a bordering pattern formed along an edge of the metal plate, and the bordering pattern has a width of 0.05 to 2 mm and a thickness of about 5 to 30 μm,
wherein the gap is surrounded by the ceramic substrate, the metal plate, and the bordering pattern, and
wherein nickel plating or nickel alloy plating is performed on the metal plate.

2. The ceramic circuit substrate according to claim 1, wherein the metal plate is a circuit pattern.

3. The ceramic circuit substrate according to claim 1, wherein the pattern of brazing material further includes a spot pattern allocated in the gap and disposed within the bordering pattern.

4. The ceramic circuit substrate according to claim 1, wherein the width of the bordering pattern is 0.1 to 1.5 mm.

5. The ceramic circuit substrate according to claim 1, wherein the bordering pattern has non-uniform width.

6. The ceramic circuit substrate according to claim 1, wherein the bordering pattern encloses the gap.

7. The ceramic circuit substrate according to claim 1, wherein the pattern of brazing material is provided such that fluid communication between the gap and an atmosphere exterior to the gap is prevented.

8. The ceramic circuit substrate according to claim 1, wherein the thickness of the bordering pattern is approximately 20 μm.

9. The ceramic circuit substrate according to claim 1, wherein the thickness of the bordering pattern is 20 μm.

10. A ceramic circuit substrate comprising:
a ceramic substrate;
a pattern of brazing material formed on the ceramic substrate;
a metal plate jointed onto the pattern of brazing material; and
a gap formed in between the ceramic substrate and the metal plate,
wherein the pattern of brazing material includes a bordering pattern formed along the edge of the metal plate, and the gap is located within the bordering pattern,
wherein bordering pattern has a width of 0.05 to 2 mm and a thickness of about 5 to 30 μm, and
wherein nickel plating or nickel alloy plating is performed on the metal plate.

11. The ceramic circuit substrate according to claim 10, wherein the metal plate is a circuit pattern.

12. The ceramic circuit substrate according to claim 10, wherein the pattern of brazing material further includes a spot pattern allocated in the gap and disposed within the bordering pattern.

13. The ceramic circuit substrate according to claim 10, wherein the width of the bordering pattern is 0.1 to 1.5 mm.

14. The ceramic circuit substrate according to claim 10, wherein the bordering pattern has non-uniform width.

15. The ceramic circuit substrate according to claim 10, wherein the bordering pattern encloses the gap.

16. The ceramic circuit substrate according to claim 10, wherein the pattern of brazing material is provided such that fluid communication between the gap and an atmosphere exterior to the gap is prevented.

17. The ceramic circuit substrate according to claim 10, wherein the thickness of the bordering pattern is approximately 20 μm.

18. The ceramic circuit substrate according to claim 10, wherein the thickness of the bordering pattern is 20 μm.

* * * * *